US006204700B1

United States Patent
Seyed

(12) United States Patent
(10) Patent No.: US 6,204,700 B1
(45) Date of Patent: Mar. 20, 2001

(54) PREDRIVER CIRCUIT FOR CONTROLLING A POWER DRIVE CIRCUIT

(75) Inventor: Ramezan Zarabadi Seyed, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/290,594

(22) Filed: Apr. 13, 1999

(51) Int. Cl.[7] ....................................................... H03K 3/00
(52) U.S. Cl. ........................... 327/108; 327/170; 327/376
(58) Field of Search ........................... 327/108–112, 170, 327/374, 376, 377, 434, 544

(56) References Cited

U.S. PATENT DOCUMENTS

| | | | |
|---|---|---|---|
| 4,967,101 | * 10/1990 | Nakamura et al. | 327/109 |
| 5,365,118 | * 11/1994 | Wilcox | 327/109 |

* cited by examiner

Primary Examiner—Kenneth B. Wells
(74) Attorney, Agent, or Firm—Jimmy L. Funke

(57) ABSTRACT

A predriver circuit (25) includes a turn on drive circuit ($25_1$) having a first amplifier stage (M42, M39) receiving a first analog current and coupled to a second amplifier stage (M33, M1) defining a circuit output ($20_1$). The turn on drive circuit ($25_1$) is responsive to a first state of a digital clock signal (VCLK) to disable operation of a turn off drive circuit ($25_2$) and supply an amplified representation of the first analog current to the circuit output ($20_1$) with controlled slew rate for optimum switching speed and electromagnetic interference (EMI) performance. The predriver circuit (25) further includes a turn off drive circuit ($25_2$) having three amplifier stages (M26–27, M24–25, M14, M2–3) responsive to a second opposite state of the digital clock signal (VCLK) to disable operation of the turn on drive circuit ($25_1$) and draw an amplified representation of a second analog current from the circuit output ($20_1$) with controlled slew rate for optimum switching speed and EMI performance. The turn on and turn off circuits ($25_1$, $25_2$) also include circuitry (M34, M36, I3, I4, N1–N4, M40, N5, I1, DM3, D1–D3, R9–10; DM5, M18, M23, I5–6, N10–13, M43, N8–9, DM4, M22, M19, M4–5) for minimizing power dissipation during respective operation thereof. The predriver circuit (25) of the present invention thus provides for high speed operation with optimum EMI performance in a high voltage environment while also minimizing power dissipation.

27 Claims, 7 Drawing Sheets

PREDRIVER CIRCUIT FOR CONTROLLING A POWER DRIVE CIRCUIT

TECHNICAL FIELD

The present invention relates generally to predriver circuits operable to control the operation of power drive circuits, and more specifically to such predriver circuits used in high voltage applications such as, for example, in controlling the operation of DC motors.

BACKGROUND OF THE INVENTION

Systems for controlling speed, torque and/or position of DC motors are known and have been widely used in a variety of applications including automotive control systems. Generally, such DC motors fall into two broad categories; namely brushed DC motors and brushless DC motors. While brushless DC motors typically offer desirable performance features and certain advantages over brushed DC motors in an automotive environment, such features and advantages may often be offset by the complexity of motor control and motor drive circuits required to accurately control motor operation. For example, controlled stoppage, accurate motor shaft positioning, motor reversal and consistent control of motor output torque are all difficult to achieve with brushless DC motors.

Dedicated systems for controlling and driving brushless DC motors are known. In such systems, a motor control circuit is typically operable to detect motor shaft position as well as motor drive current, and a motor drive circuit is, in turn, responsive to motor control signals supplied by the motor control circuitry to drive the DC motor in a desired manner. In known DC motor drive circuits, the motor driving function is often partitioned into a two-stage drive operation; namely a pre-driver circuit and a power drive circuit. The pre-driver circuit typically serves as an interface between a motor control logic circuit and a power drive device such as a discrete power transistor, wherein the pre-driver circuit is operable to convert the logic level motor control signals to one or more signals suitable for driving the power drive device.

While known pre-driver circuits have been widely used in various DC brushless motor control systems, such pre-driver circuits suffer from several drawbacks, particularly when used in automotive applications. For example, known pre-driver circuits in automotive applications are often strictly analog circuits that suffer from slow response time and high power dissipation. Conversely, while known digital pre-driver circuits may provide for fast and accurate motor control, such systems are typically incapable of supplying such control in a high voltage automotive environment, and are consequently not often used. In either case, electromagnetic interference (EMI) requirements are difficult to satisfy in a high voltage environment, and known pre-driver circuits often suffer from deleterious effects resulting from EMI. What is therefore needed is an improved pre-driver circuit for a motor control system that is both power efficient and capable of high speed operation in a high voltage automotive environment. Ideally, such an improved pre-driver circuit should also be compatible with imposed EMI requirements.

SUMMARY OF THE INVENTION

The present invention addresses the foregoing shortcomings in known motor drive circuits. In accordance with one aspect of the present invention, a predriver circuit for controlling a power drive circuit comprises a turn on drive circuit having a first analog input adapted to receive a first analog signal and an analog output adapted for connection to an input of a power drive circuit, wherein the turn on drive circuit is responsive to one of an active and an inactive state of a first digital signal to supply an amplified representation of the first analog signal to the analog output. The turn on drive circuit is further responsive to the other of an active and an inactive state of the first digital control signal to disable supply of the amplified representation of the first analog signal to the analog output. Also included is a turn off drive circuit having a second analog input adapted to receive a second analog signal and an analog output defined by the analog output of the turn on drive circuit, wherein the turn off drive circuit is responsive to the other of an active and inactive state of the first digital control signal to draw an amplified representation of the second analog signal from the analog output. The turn off drive circuit is further responsive to the one of an active and an inactive state of the first digital control signal to disable draw of the amplified representation of the second analog signal from the analog output.

In accordance with another aspect of the present invention, a predriver circuit for controlling a power drive circuit comprises a first analog signal amplifier defining an input adapted to receive a first analog signal and a second analog signal amplifier coupled to the first analog signal amplifier and defining an output adapted for connection to an input of a power drive circuit, wherein the first and second analog amplifiers are responsive to a first state of a predriver control signal to supply an amplified representation of the first analog signal to the output. A sense circuit is included and is responsive to detection of the amplified representation of the first analog signal to disable operation of the first analog signal amplifier and a first portion of the second analog amplifier to thereby reduce electrical power consumed thereby. Also included is a control circuit responsive to disablement of the first analog signal amplifier to maintain a second portion of the second analog amplifier operable to thereby maintain the output near a predefined signal level for a duration of the first state of the predriver control signal. A turn off drive circuit is further included and is responsive to a second state of the predriver control signal to draw a second analog signal from the output.

In accordance with a further aspect of the present invention, a predriver circuit for controlling a power drive circuit comprises a turn on drive circuit responsive to a first state of a predriver control signal to supply a first analog signal to a predriver circuit output thereof, wherein the predriver circuit output is adapted for connection to an input of a power drive circuit, a first analog signal amplifier defining an input adapted to receive a second analog signal, a second analog signal amplifier having an input coupled to the first analog signal amplifier and defining a second amplifier output, a third analog signal amplifier coupled to the second amplifier output and defining an output connected to the predriver circuit output, wherein the first, second and third amplifiers are responsive to a second opposite state of the predriver control signal to draw an amplified representation of the second analog signal from the predriver circuit output, a sense circuit responsive to detection of the amplified representation of the second analog signal drawn from the predriver circuit output to disable operation of the first and second analog signal amplifiers and a first portion of the third analog signal amplifier to thereby reduce electrical power consumed thereby, and a control circuit responsive to disablement of the first and second analog signal amplifiers and the first portion of the third analog signal amplifier to maintain a second portion of the third analog signal amplifier operable to thereby maintain the predriver circuit output near a predefined signal level for a duration of the second state of the predriver control signal.

In accordance with yet another aspect of the present invention, a predriver circuit for controlling a power drive circuit comprises a turn on drive circuit having a first analog input adapted to receive a first analog signal and an analog output adapted for connection to an input of a power drive circuit, wherein the turn on drive circuit is responsive to one of an active and an inactive state of a first digital signal to supply an amplified representation of the first analog signal to the analog output and to produce a digital turn off circuit disable signal. Also included is a turn off drive circuit having a second analog input adapted to receive a second analog signal and an analog output defined by the analog output of the turn on drive circuit, wherein the turn off drive circuit is responsive to the other of an active and inactive state of the first digital control signal to draw an amplified representation of the second analog signal from the analog output and to produce a digital turn on circuit disable signal. The turn on circuit is further responsive to the digital turn on circuit disable signal to disable operation thereof by disabling supply of the amplified representation of the first analog signal to the analog output, and the turn off circuit is further responsive to the digital turn off circuit disable signal to disable operation thereof by disabling draw of the amplified representation of the second analog signal from the analog output.

One object of the present invention is to provide an improved predriver circuit for controlling operation of a motor drive circuit.

Another object of the present invention is to provide such an improved predriver circuit capable of high speed operation in a high voltage environment while also minimizing power dissipation.

Yet another object of the present invention is to provide an improved predriver circuit that operates in a high voltage environment while also satisfying imposed EMI requirements.

These and other objects of the present invention will become more apparent from the following description of the preferred embodiment.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
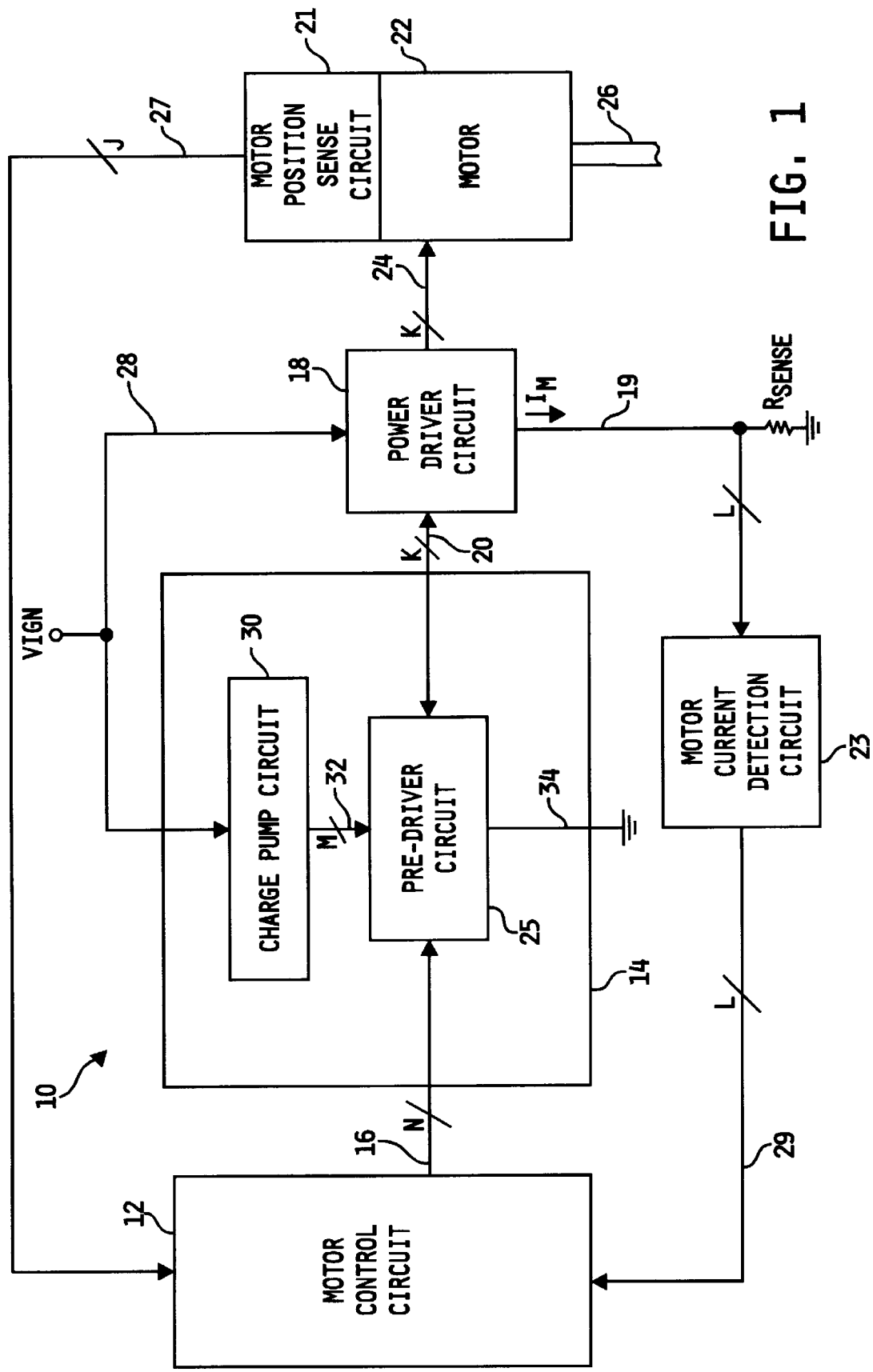
FIG. 1 is diagrammatic illustration of one embodiment of a motor control system, in accordance with the present invention.

Referring now to FIG. 1, one embodiment of a motor control system 10, in accordance with the present invention, is illustrated. System 10 includes a DC motor 22, which is preferably a known brushless DC motor, operable to drive a rotor or output shaft 26 thereof as is known in the art. Motor 22 is electrically connected to a power driver circuit 18 via a number, K, of signal paths 24, wherein K may be any integer. Power driver circuit 18 is, in turn, electrically connected to a motor driver control circuit 14 via a corresponding number, K, of signal paths 20. Motor driver control circuit 14 is, in turn, electrically connected to a motor control circuit 12 via a number, N, of signal paths 16, wherein N may be any integer.

A motor position sense circuit 21 is associated with motor 22 and is electrically connected to motor control circuit 12 via a number, J, of signal paths 27, wherein J may be any integer. Motor position sense circuit 21 is operable to sense a position of rotor 26 relative to a motor armature (not shown) in a known manner, and in one preferred embodiment motor position sense circuit 21 includes a number of Hall effect sensors operable to sense rotor position and provide a corresponding number of rotor position signals on signal path 27 as is known in the art. Alternatively, sense circuit 21 may include a number of other known sensors or sensing circuits operable to sense rotor position and produce a corresponding number of rotor position signals, an example of which includes, but is not limited to, a variable reluctance sensor. In either case, motor position sense circuit 21 is operable to provide a number, J, of motor position signals to motor control circuit 12 via a corresponding number, J, of signal paths 27.

A motor current detection circuit 23 is electrically connected to the power driver circuit 18 via a number, L, of signal paths 19, wherein L may be any integer, and is also connected to motor control circuit 12 via a corresponding number, L, of signal paths 29. In one preferred embodiment, motor winding current $I_M$ is directed through one or more sense resistors $R_{SENSE}$, wherein a corresponding sense voltage developed thereacross is provided to motor current detection circuit 23, although the present invention contemplates that the motor winding current $I_M$ may be alternatively sensed by other known techniques wherein one or more signals corresponding to motor winding current are provided to motor current detection circuit 23. Motor current detection circuit 23 preferably includes a sense amplifier circuit of the type described in co-pending U.S. patent application Ser. No. 09/290,835 filed by Seyed R. Zarabadi and having attorney docket number H-205167, and a DC offset compensation circuit of the type described in co-pending U.S. patent application Ser. No. 09/290,929 filed by Seyed R.

Zarabadi et al., both of which are assigned to the assignee of the present invention, However, the present invention contemplates that other known motor current sense circuits may be used to provide motor control circuit 12 with at least one analog signal corresponding to motor winding current.

In one embodiment, motor control circuit 12 is a microprocessor or microprocessor-based control circuit operable to control motor driver control circuit 14 based, at least in part, on the one or more motor current signals provided thereto by motor current detection circuit 23 and on the one or more motor position signals provided thereto by motor position sense circuit 21. In any case, motor control circuit 12 is operable to control the operation of motor 22 via appropriate control signals provided to motor driver control circuit 14 via signal paths 16.

In accordance with the present invention, motor driver control circuit 14 is operable to provide appropriate pre-drive signals on signal paths 20, whereby the power driver circuit 18 is responsive to such signals to drive motor 22 to thereby actuate rotor 26 in a desired manner as is known in the art. In one embodiment, the motor driver control circuit 14 includes a pre-driver circuit 25 that is electrically connected to power driver circuit 18 via the number, K, of signal paths 20, and is electrically connected to motor control circuit 12 of known construction via the number, N, of signal paths 16. A voltage supply (not shown) is operable to supply an electrical power signal VIGN (e.g., vehicle battery voltage or other desired voltage), wherein VIGN is connected to power driver circuit 18 and to a charge pump circuit 30 of known construction, and wherein charge pump circuit 30 forms part of motor driver control circuit 14. The charge pump circuit 30 is electrically connected to predriver circuit 25 via a number, M, of signal paths 32, whereby charge pump circuit 30 is operable to supply predriver circuit 25 with one or more DC supply voltages as is known in the art. Both the charge pump circuit 30 and the predriver circuit 25 are referenced to ground potential via signal path 34.

Figure 2:
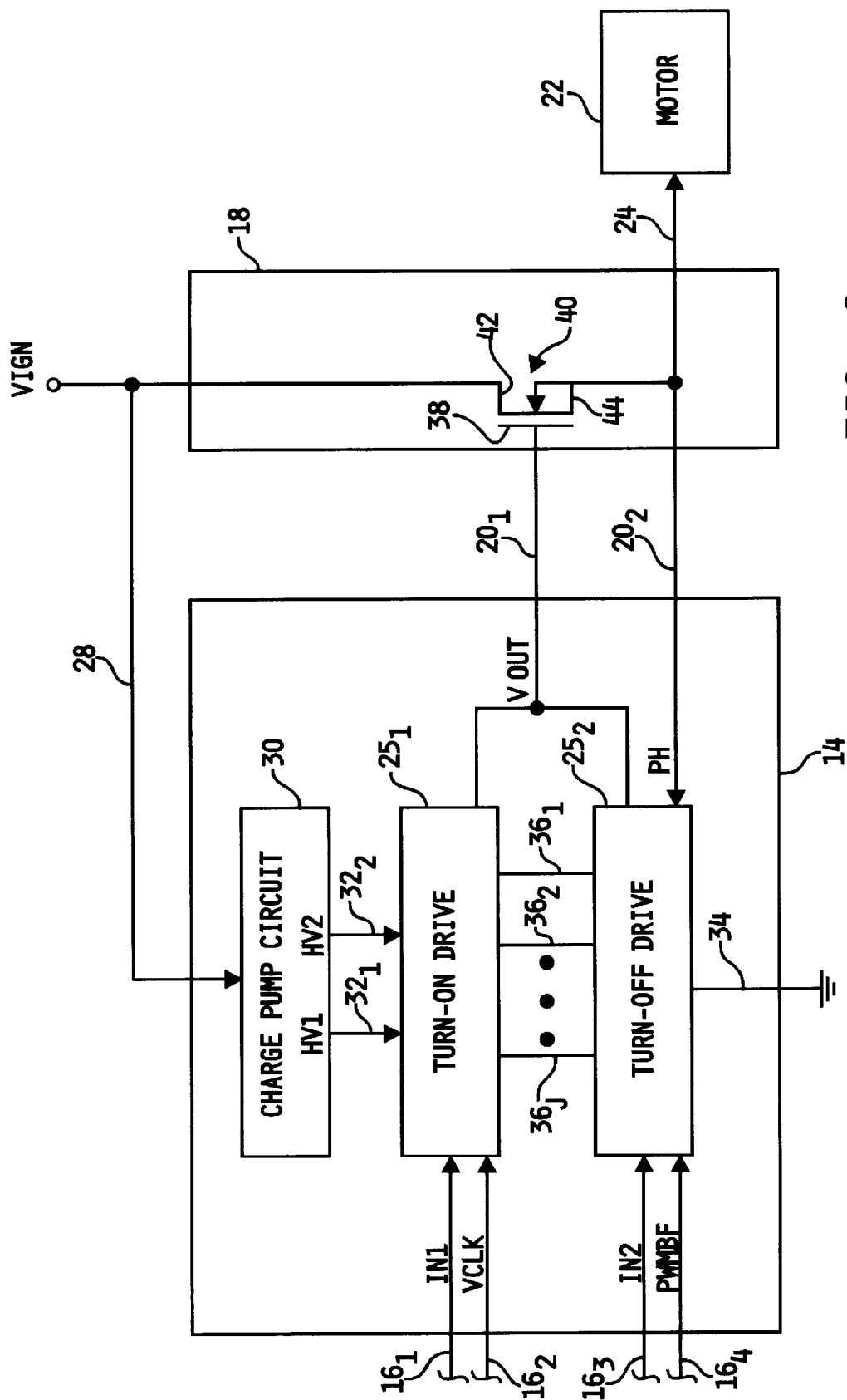
FIG. 2 is a diagrammatic illustration of the motor driver portion of the motor control system illustrated in FIG. 1, showing further details of the predriver and power drive circuits, in accordance with the present invention.

Referring now to FIG. 2, a simplified diagram of one preferred embodiment of the motor driver control circuit 14 and power driver circuit 18, in accordance with the present invention, are shown. In this embodiment, the predriver circuit 25 is partitioned into a turn-on drive circuit $25_1$ and a turn-off drive circuit $25_2$, wherein the two subcircuits $25_1$ and $25_2$ are in electrical communication with each other via a number, J, of signal paths $36_1$, $36_2$, . . . , $36_J$ as will be described more fully hereinafter. Turn-on drive circuit $25_1$ defines a first input IN1 adapted to receive a first input signal from motor control circuit 12 via signal path $16_1$ and a second input VCLK adapted to receive a second input signal from motor control circuit 12 via signal path $16_2$. Preferably, the first input signal received by turn-on drive circuit $25_1$ at input IN1 is a substantially constant-valued analog current signal I1, although the present invention contemplates that the first input signal may alternatively be a current signal that is varying or variable in accordance with a desired variation criteria. The second input signal received by turn-on drive circuit $25_1$ at input VCLK is preferably a digital control signal operable to control turn-on and turn-off operation of both circuits $25_1$ and $25_2$ as will be described in greater detail hereinafter. The VCLK signal is accordingly provided to the turn-off drive circuit $25_2$ via one of the signal paths $36_J$ as will be subsequently described.

Turn-off drive circuit $25_2$ defines a first input IN2 adapted to receive a third input signal from motor control circuit 12 via signal path $16_3$ and a second input PWMBF adapted to receive a fourth input signal from motor control circuit 12 via signal path $16_4$. Preferably, the third input signal received by turn-off drive circuit $25_2$ at input IN2 is a substantially constant-valued analog current signal I2, although the present invention contemplates that the third input signal may alternatively be a current signal that is varying or variable in accordance with a desired variation criteria. The fourth input signal received by turn-off drive circuit $25_2$ at input PWMBF is preferably a digital control signal that is asserted whenever motor 22 is active; i.e., whenever motor position determination circuit 12 is operable to command operation of motor 22. The PWMBF signal is provided to turn-on drive circuit $25_1$ for control thereof via one of the signal paths $36_J$ as will be subsequently described.

In the embodiment illustrated in FIG. 2, the charge pump circuit 30 is responsive to the VIGN supply signal to produce a first high voltage level HV1 on signal path $32_1$ and a second high voltage level HV2 on signal path $32_2$. In one embodiment wherein VIGN is nominally 12.0 volts (although VIGN may be any desired voltage), charge pump circuit 30 is operable to produce a HV1 voltage of approximately 30 volts and a HV2 voltage of approximately 15 volts, although the present invention contemplates other values of HV1 and HV2. In an alternate embodiment, boost voltages HV1 and HV2 are supplied by remote voltage sources (not shown) so that charge pump circuit 30 may be omitted from motor driver control circuit 14. In any case, turn-on drive circuit $25_1$ and turn-off drive circuit $25_2$ define a common output that produces an output signal VOUT suitable for controlling/driving a load such as the power driver circuit 18.

The power driver circuit 18, in the embodiment illustrated in FIG. 2, includes at least one power transistor such as a power metal oxide semiconductor field effect transistor (power MOSFET) suitable for driving motor 22 from VIGN supply. It is to be understood, however, that the power driver circuit 18 may alternatively or additionally include one or more power bipolar junction transistors (power BJT), insulated gate bipolar transistors (IGBT) or other known transistor variations, as well as one or more relays and/or other suitable switching devices, although power driver circuit 18 will be described hereinafter for the purpose of brevity as including only a single power MOSFET 40. The output of motor driver control circuit 14 is electrically connected to the gate 38 of MOSFET 40 via signal path $20_1$, and the drain 42 of MOSFET 40 is connected to the VIGN supply. The source 44 of MOSFET 40 is electrically connected to motor 22 via signal path 24, and to a phase input PH of turn-off drive circuit $25_2$ via signal path $20_2$.

In operation, the turn-on drive circuit $25_1$ is responsive to a first state of the digital VCLK signal to amplify the input current I1 received at input IN1 and supply α*I1 source current to VOUT (and accordingly to the gate 38 of MOSFET 40), wherein α is the gain of turn-on drive circuit $25_1$, while the turn-off drive circuit $25_2$ is responsive to the first state of the digital VCLK signal to disable operation thereof. The turn-off drive circuit $25_2$ is responsive to a second opposite state of the digital VCLK signal to amplify the input current I2 received at input IN2 and draw a current β*I2 from VOUT (and accordingly from the gate 38 of MOSFET 40), wherein β is the gain of turn-off drive circuit $25_2$, while the turn-on drive circuit $25_1$ is responsive to the second opposite state of the digital VCLK signal to disable operation thereof. In accordance with one aspect of the present invention, the predriver circuit 25 is thus preferably partitioned into two subcircuits; namely a turn-on drive circuit $25_1$ and turn-off drive circuit $25_2$, whereby the turn-on circuit $25_1$ is operable to turn on MOSFET 40 and the turn-off drive circuit $25_2$ is operable to turn off MOSFET 40. Both subcircuits $25_1$ and $25_2$ are preferably configured for digital control and communication therebetween and also with the motor position determination circuit 16 so that the partitioned high voltage switching operation of MOSFET 40 may be carried out at high speed. Moreover, and as will be described in greater detail hereinafter, the turn-on drive circuit $25_1$ and turn-off drive circuit $25_2$ are preferably configured to control MOSFET 40 as just described while minimizing the amount of electrical power drawn from supply HV1 by each subcircuit $25_1$ and $25_2$.

As previously described, input currents I1 and I2 received at inputs IN1 and IN2 respectively are preferably constant-valued (DC) currents. In accordance with another aspect of the present invention, the respective magnitudes of I1 and I2 determine, at least in part, both the rise and fall times (slew rate) of the output signal VOUT provided on signal path $20_1$ as well as the electromagnetic interference (EMI) generated by motor driver control circuit 14. In general, lower I1 and I2 values correspond to lower generated EMI values, but also to slower slew rates. Conversely, higher I1 and I2 values correspond to faster slew rates, but also to higher generated EMI values. Accordingly, the current values I1 and I2 are chosen to optimize a trade-off between slew rate and EMI requirements, and those skilled in the art will recognize that the I1 and I2 values chosen will typically be dictated by slew rate and EMI requirements of the particular application of motor driver control circuit 14.

Figure 3:
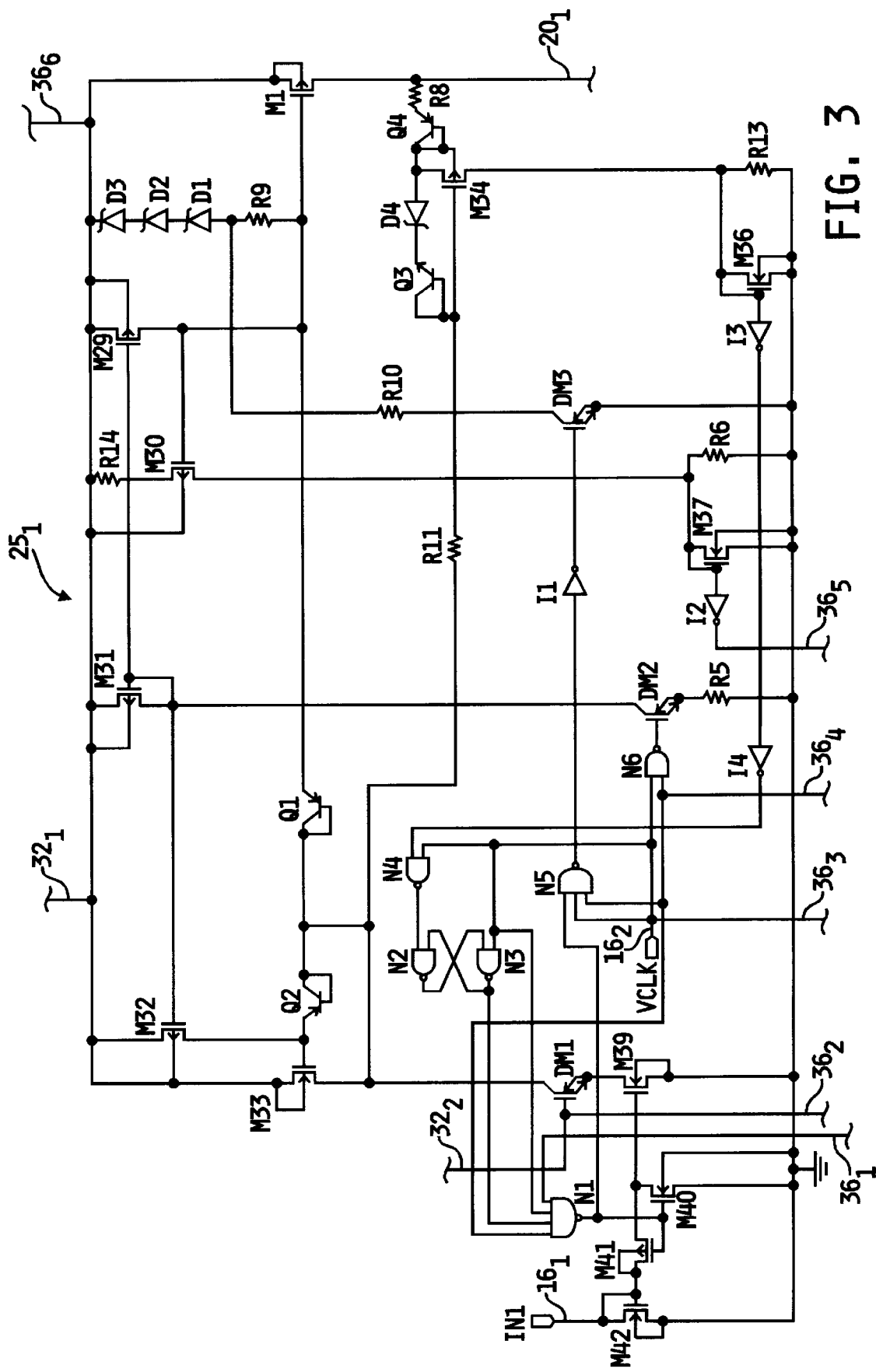
FIG. 3 is a schematic diagram of one preferred embodiment of the turn on drive circuit of the predriver circuit illustrated in FIGS. 1 and 2, in accordance with the present invention.

Referring now to FIG. 3, one preferred embodiment of a device-level implementation of the turn-on circuit $25_1$, in accordance with the present invention, is shown. Input In1 (signal path $16_1$) is connected to a gate and drain of a n-MOS transistor M42 and to the source of a p-MOS transistor M41. The gate of M41 is connected to the output of a NAND gate N1, to a first input of another NAND gate N5 and to the gate of a n-MOS transistor M40. The drain of M40 is connected to the drain of M41 and to the gate of a n-MOS transistor M39, and the sources of M39, M40 and M42 are connected to ground potential. The drain of M39 is connected to the source of a DMOS transistor DM1 having a gate connected to high voltage HV2 of charge pump circuit 30 via signal path $32_2$ and also to signal path $36_1$ leading to turn-off drive circuit $25_2$.

A first input of N1 is connected to turn-off drive circuit $25_2$ via signal path $36_2$ and a second input of N1 is connected to a first input of a NAND gate N3, to a first input of another NAND gate N4, to a first input of yet another NAND gate N6, to a second input of N5, to input VCLK $16_2$ and to turn-off drive circuit $25_2$ via signal path $36_3$. A third input of N1 is connected to the output of N3 and to a first input of a NAND gate N2. The output of N2 is connected to a second input of N3, and a second input of N2 is connected to the output of N4. A second input of N4 is connected to an output of an inverter I4 having an input connected to an output of another inverter I3. A fourth input of N1 is connected to a third input of N5, to a second input of N6 and to turn-off drive circuit $25_2$ via signal path $36_4$. The output of N5 is connected to the input of an inverter I1 having an output connected to the gate of a DMOS transistor DM3 and the output of N6 is connected to the gate of another DMOS transistor DM2. The source of DM2 is connected to one end of a resistor R5 having an opposite end connected to ground potential. The drain of DM2 is connected to the gate and drain of a p-MOS transistor M31, to the gate of another p-MOS transistor M32 and to the gate of yet another p-MOS transistor M29. The sources of M29, M31 and M32 are connected to high voltage HV1 provided by charge pump circuit 30 via signal path $32_1$.

The drain of DM1 is connected to the drain of a n-MOS transistor M33, to the collector and base of a PNP transistor Q1, to the collector and base of another PNP transistor Q2 and to one end of a resistor R11. The emitter of Q2 is connected to the gate of M33 and to the drain of M32, and the source of M33 is connected to HV1 via signal path $32_1$. The emitter of Q1 is connected to the drain of M29, to one end of a resistor R9, to one end of a resistor R10, to the gate of a p-MOS transistor M30 and to the gate of a p-MOS transistor M1. The opposite end of R9 is connected to the anode of a diode D1 having a cathode connected to the anode of another diode D2 having a cathode connected to the cathode of still another diode D3. The cathode of D3 is connected to the source of M1 and to HV1 via signal path $32_1$. The opposite end of R10 is connected to the drain of DM3 and the source of DM3 is connected to ground potential.

The source of M30 is connected to one end of a resistor R14 having an opposite end connected to HV1 via signal path $32_1$. The drain of M30 is connected to one end of a resistor R6 and to the gate, to the drain of a n-MOS transistor M37 and to the input of an inverter gate I2 having an output connected to turn-off drive circuit $25_2$ via signal path $36_5$. The opposite end of R6 and the source of M37 are connected to ground potential.

The drain of M1 defines the output VOUT of pre-driver circuit 25 (signal path $20_1$) and is connected to one end of a resistor R8. The opposite end of R8 is connected to the emitter of a PNP transistor Q4 having a base and collector connected to the source of a p-MOS transistor M34 and to the anode of a diode D4. The cathode of D4 is connected to the emitter of a NPN transistor Q3 having a base and collector connected to the opposite end of R11. The drain of M34 is connected to one end of a resistor R13, to the gate and drain of a transistor M36 and to the input of I3. The opposite end of R13 and the source of M36 are connected to ground potential.

Transistors M39 and M42 define a first amplifier stage that may be activated and deactivated via control of M40. Transistors M33 and M1 define a second amplifier stage wherein the differential pair M33 and M1 are decoupled from each other via Q1 and Q2. The overall gain cc of turn-on drive circuit $25_1$ is defined by the physical size/area ratio of any of the devices M42, M39, M33 and M1. R8, Q4, M34, R13, M36, D4, Q3 and R11 define a sense circuit operable to sense the voltage level of VOUT and provide a digital signal corresponding thereto. M30, R14, R6, M37 and I2 define a control circuit operable to monitor the gate drive of M1 and provide a digital signal corresponding thereto. The operation of each of these foregoing subcircuits as they relate to the operation of turn-on drive circuit $25_1$ and to the overall operation of pre-driver circuit 25 will be described in detail hereinafter following a description of the turn-off drive circuit $25_2$.

Figure 4:
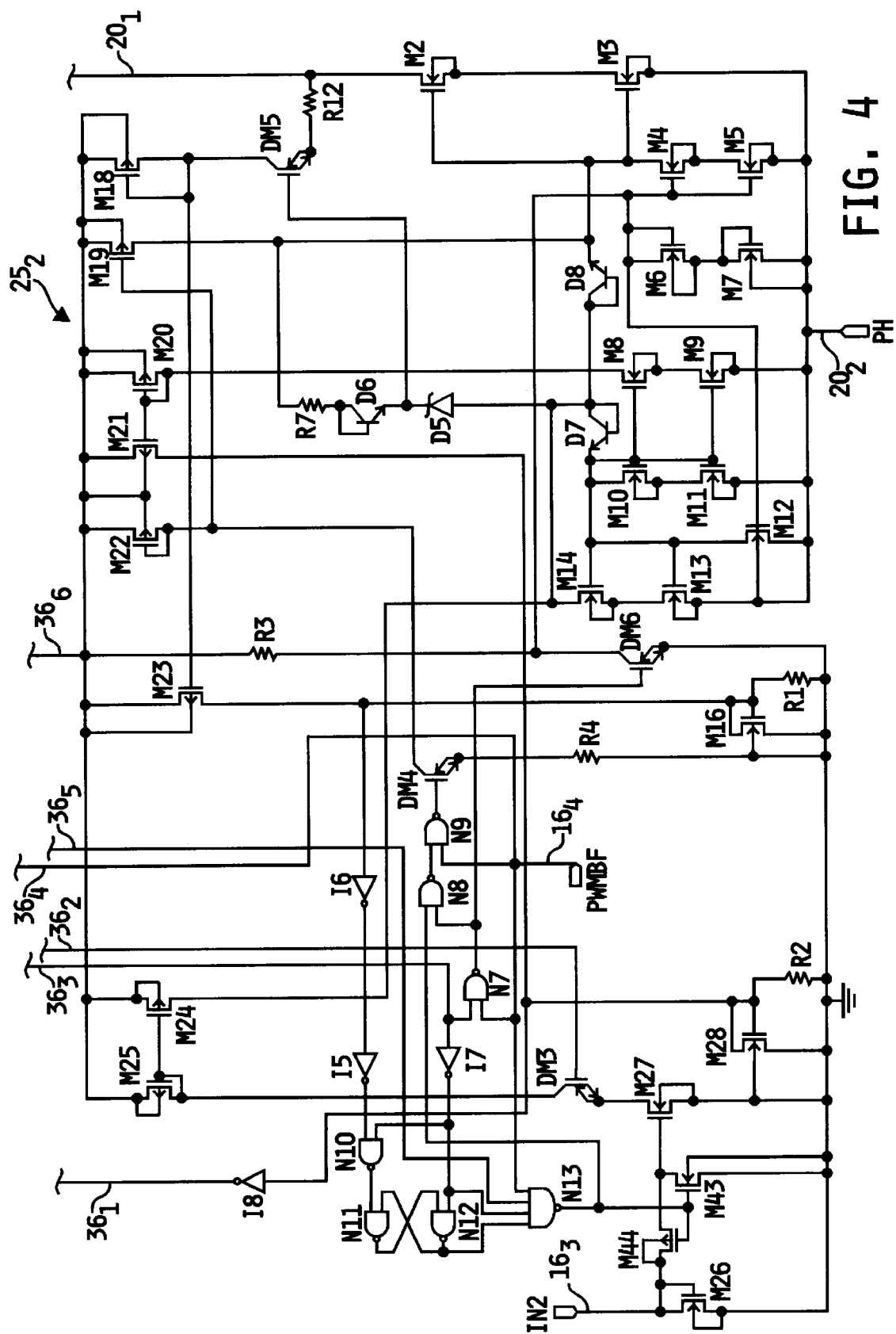
FIG. 4 is a schematic diagram of one preferred embodiment of the turn off drive circuit of the predriver circuit illustrated in FIGS. 1 and 2, in accordance with the present invention.

Referring now to FIG. 4, one preferred embodiment of a device-level implementation of the turn-off drive circuit $25_2$, in accordance with the present invention, is shown. Input IN2 (signal path $16_3$) is connected to the gate and drain of a n-MOS transistor M26 and to the source of a p-MOS transistor M44. The gate of M44 is connected to the gate of a n-MOS transistor M43, to the output of a NAND gate N13 and to a first input of another NAND gate N8. The drain of M43 is connected to the drain of M44 and to the gate of a n-MOS transistor M27. The sources of M26, M27 and M43 are connected to ground potential. The drain of M27 is connected to the source of a DMOS transistor DM3 having a gate connected to the high voltage line HV2 of turn-on drive circuit $25_1$ via signal path $36_2$. The drain of DM3 is connected to the gate and drain of a p-MOS transistor M25 and to the gate of another p-MOS transistor M24. The sources of M24 and M25 are connected to the high voltage line HV1 of turn-on drive circuit $25_1$ via signal path $36_6$.

A first input of N13 is connected to a first input of a NAND gate N7, to a first input of another NAND gate N9, to input PWMBF (signal line $16_4$) and to turn-on drive circuit $25_1$ via signal path $36_4$. A second input of N13 is connected to turn-on drive circuit $25_1$ via signal path $36_5$, and a third input of N13 is connected to the output of an inverter I7, a first input of another NAND gate N10 and to a first input of yet another NAND gate N12. A fourth input of N13 is connected to the output of N12 and to a first input of another NAND gate N11. The output of N11 is connected to a second input of N12 and a second input of N11 is connected to the output of N10. A second input of N10 is connected to the output of an inverter I5 having and input connected to the output of another inverter I6. The input of I6 is connected to the drain of a p-MOS transistor M23 and to the gate and drain of a n-MOS transistor M16 and to one end of a resistor R1. The opposite end of R1 and the source of M16 are connected to ground potential, and the source of M23 is connected to HV1 via signal path $36_6$.

The input of I7 is connected to a second input of N7 and to turn-on drive circuit $25_1$ via signal path $36_3$. The output of N7 is connected to a second input of N8 and to the gate of a DMOS transistor DM6 having a source connected to ground potential and a drain connected to one end of a resistor R3. The opposite end of R3 is connected to HV1 via signal path $36_6$. The output of N8 is connected to a second input of N9, wherein the output of N9 is connected to the gate of a DMOS transistor DM4 having a source coupled to ground potential through a resistor R4. The drain of DM4 is connected to the gate and drain of a p-MOS transistor M22 and to the gate of another p-MOS transistor M19.

The drain of M24 is connected to the drain of a n-MOS transistor M14, to the base and collector of a NPN transistor D7, to the base and collector of another NPN transistor D8 and to the anode of a diode D5. The emitter of D7 is connected to the gate and drain of a transistor M10, to the gate of another n-MOS transistor M11, to the gate of M14, to the gate of another n-MOS transistor M8, to the gate of yet another n-MOS transistor M9, to the gate of a still another transistor M13 and to the drain of a further n-MOS transistor M12. The drain of M13 is connected to the source of M14 and the drain of M11 is connected to the source of M10, and the drain of M9 is connected to the source of M8. The sources of M9, M11, M12 and M13 are connected to phase input PH (signal path $20_2$). The drain of M8 is connected to the gate and drain of a p-MOS transistor M20 and to the gate of another p-MOS transistor M21. The sources of M20 and M21 are connected to HV1 via signal path $36_6$. The drain of M21 is connected to the input of an inverter 18 having an output connected to the turn-on drive circuit $25_1$ via signal path $36_1$.

The emitter of D8 is connected to the drain of M19, to one end of a resistor R7, to the gate of a n-MOS transistor M2, to the gate of another n-MOS transistor M3, and to the drain of yet another n-MOS transistor M4. The drain of M3 is connected to the source of M2 and the drain of a n-MOS transistor M5 is connected to the source of M4. The gates of M4 and M5 are connected to the gate and drain of a n-MOS transistor M6 and to the gate of M12. The source of M6 is connected to the gate and drain of a n-MOS transistor M7 and the sources of M3, M5 and M7 are connected to phase input PH.

The drain of M2 is connected to one end of a resistor R12 to turn-on drive circuit $25_1$ via signal path $20_1$. The drain of M2 of turn-off drive circuit $25_2$ and the drain of M1 of turn-on drive circuit $25_1$ define the output VOUT of pre-river circuit 25. The opposite end of R12 is connected to the source of a DMOS transistor DM5 having a drain connected to the gate and drain of a p-MOS transistor M18 and to the gate of M23. The source of M18 is connected to HV1 via signal path $36_6$, and the gate of DM5 is connected to the cathode of D5 and to the emitter of a NPN transistor D6. The base and collector of D6 are connected to the opposite end of R7.

Transistors M26 and M27 define a first amplifier stage of turn-off drive circuit $25_2$ that may be activated and deactivated via control of M43. Transistors M25 and M24 define a second amplifier stage, and transistors M13/M14 and M2/M3 define a third amplifier stage, wherein the differential pairs M13/M14 and M2/M3 are decoupled from each other via D7 and D8. The overall gain β of turn-off circuit $25_2$ is defined by the physical size/area ratio of any of the devices M24–M27, M13/M14 and M2/M3. R12, DM5, M18, M23, M16 and R1 define a sense circuit operable to sense the voltage level of VOUT and provide a digital signal corresponding thereto. M8–M11 and M20–21 define a control circuit operable to monitor the gate drive of M2/M3 and provide a digital signal corresponding thereto. The operation of each of these foregoing subcircuits as they relate to the operation of turn-off drive circuit $25_2$ and to the overall operation of pre-driver circuit 25 will now be described in detail with respect to FIGS. 1–4.

The overall operation of pre-driver circuit 25, i.e., whether to drive VOUT high or low, is determined by the state of the VCLK signal, and the PWMBF signal is asserted whenever the motor 22 is active. When VCLK transitions from a low to a high state and PWMBF is in an active (e.g., high) state, the gate of M40 is commanded low and the first amplifier stage of turn-on drive circuit $25_1$ comprising M42 and M39 is activated. At the same time, the gates of DM2 and DM3 are commanded low so that the devices M29, M31, M32 and DM3 are deactivated thereby allowing operation of the second amplifier stage comprising M33 and M1 such that VOUT is driven to a high state (near HV1) and M1 is operable to source the current αI1. When the second amplifier stage is activated as just described, transistor M30 turns on and changes the state of the output of inverter 12 which is fed to NAND gate N13. NAND gate N13 is responsive to the change of state of I2 to activate transistor M43, thereby disabling the turn-off drive circuit $25_2$. Moreover, the high state of VCLK turns off DM6 (turn-off drive circuit $25_2$), thereby maintaining the third amplifier stage of turn-off drive circuit $25_2$ in a deactivated state with M2/M3 turned off.

The sense circuit comprising M34 and related components is operable to monitor the voltage VOUT on signal path $20_1$, and when VOUT approaches HV1, M34 turns on and changes the state of the output of N1 thereby activating M40 and DM3. Activation of M40 disables the first amplifier stage comprising M42 and M39 by disabling M39 and further disables a portion of the second amplifier stage comprising M33. Activation of DM3 results in pulling the gate of M1 low so as to maintain VOUT near HV1 for the remainder of the high state of VCLK even though M39 and M33 have been disabled. Since M33 is decoupled from M1, M1 may be activated and deactivated separately from M33. Resistors R9 and R10, and diodes D1–D3 are chosen so as to maintain a predefined on resistance of M1 for the duration of the high state of VCLK such that M1 is operable to supply a desired load current to signal path $20_1$, and those skilled in the art will recognize that the on resistance of M1 that is established by turning on DM3 may be set at any desired value that will be typically dictated by the load connected to signal path $20_1$.

When VCLK changes from a high to a low state, the output of N1 maintains M40 activated, thereby maintaining the first amplifier stage and one-half of the second amplifier stage (e.g., M33) of the turn-on drive circuit $25_1$ deactivated as long as VCLK remains in a low state. A low VCLK state also activates DM2 which pulls the gates of M33 and M1 near HV1 thereby ensuring that the entire second amplifier stage of turn-on drive circuit 251 remains deactivated and M1 supplies no current to signal path $20_1$ as long as VCLK remains low. Activation of M29 also deactivates M30, thereby changing the state of I2 and enabling VCLK control of N13.

A transition of VCLK from high to low also activates DM6, thereby enabling the third output stage of turn-off drive circuit $25_2$, and commanding the gate of M43 low, thereby activating the first, second and third amplifier stages comprising M26 and M27, M24 and M25, and M14 and M2/M3 respectively. Activation of the three amplifier stages of turn-off drive circuit $25_2$ provides sufficient gate drive to M2/M3 to pull VOUT low and draw a load current βI2 therefrom. When the third amplifier stage is activated as just described, transistors M8–M11 and M21–22 turn on and change the state of the output of inverter 18 which is fed to NAND gate N1. NAND gate N1 is responsive to the change of state of I8 to maintain transistor M40 activated, thereby ensuring that the turn-on drive circuit $25_1$ remains deactivated while the turn-off drive circuit $25_2$ is activated.

The sense circuit comprising DM5 and related components is operable to monitor the voltage VOUT on signal path $20_1$, and when VOUT drops sufficiently below the voltage at the cathode of D5, DM5 turns on and activates current mirror M18/M23 thereby changing the state of the output of N13 and activating M43 and DM4. Activation of M43 disables the first amplifier stage comprising M26 and M27 by disabling M27, which thereby disables the second amplifier stage comprising M24 and M25, and further disables a portion of the third amplifier stage comprising M13/M14. Activation of DM4 activates current mirror M22/M19 thereby providing sufficient gate drive to M2/M3 to maintain VOUT near PH potential for the remainder of the low state of VCLK even though M24–M27 and M13/M14 have been disabled. Since M13/M14 is decoupled from M2/M3, M2/M3 may be activated and deactivated separately from M13/M14. Resistors R4 and R7, and diodes D5–D7 are chosen so as to maintain a predefined on resistance of M2/M3 for the duration of the low state of VCLK such that M2/M3 is operable to draw a desired load current from signal path $20_1$, and those skilled in the art will recognize that the on resistance of M2/M3 that is established by turning on DM4 may be set at any desired value that will be typically dictated by the load connected to signal path $20_1$. When VCLK thereafter changes from a low to a high state, the above-described process repeats.

Figure 5:
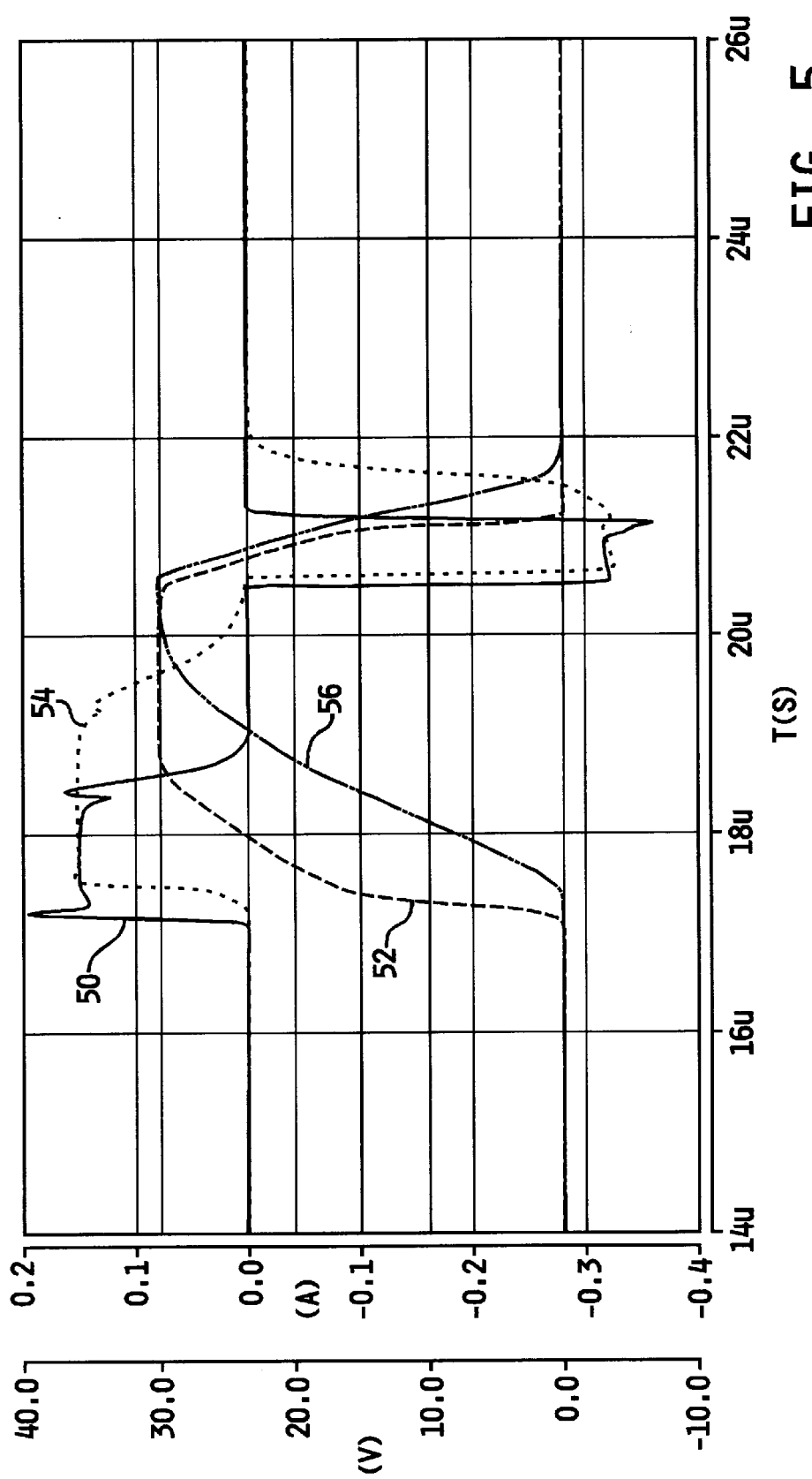
FIG. 5 is a plot illustrating the operation of the predriver circuit of FIGS. 1–4 showing example predriver circuit output voltages and output transistor drain currents vs. time for two temperature extremes and for one set of supply voltages.

Referring now to FIG. 5, a plot of VOUT 52 and $I_{LOAD}$ 50 for −40° C., and VOUT 56 and $I_{LOAD}$ 54 for 150° C., are shown illustrating the operation of pre-driver circuit 25 wherein $I_{LOAD}$ is the M1/M2/M3 current flowing into VOUT, and wherein HV1=30 volts and HV2=15 volts. As is evident from FIG. 5, as VOUT rises (in response to a high VCLK signal) $I_{LOAD}$ is supplied via M1 until VOUT reaches a voltage near HV1, after which the first and part of the second amplifier stages of turn-on drive circuit $25_1$ are disabled thereby reducing $I_{LOAD}$ Similarly, as VOUT falls (in response to a low VCLK signal) $I_{LOAD}$ is drawn by M2/M3 until VOUT reaches a voltage near ground potential, after which the first, second and part of the third amplifier stages of turn-off drive circuit $25_2$ are disabled thereby reducing $I_{LAOD}$.

The pre-driver circuit 25 of the present invention provides for several advantageous features. For example, since turn on and turn off operations of pre-driver circuit 25 are controlled by digital signals (e.g., VCLK and PWMBF) and digital circuitry, circuit 25 exhibits very fast turn on and turn off response times with controlled slew rates to thereby minimize EMI production. Furthermore, since the turn-off output circuitry is referenced to a phase voltage rather than ground potential, VOUT may accordingly be driven several volts below system ground without damaging M2/M3 or impacting the speed and/or operational characteristics of the pre-river circuit 25. Moreover, the design of the output stage of the turn-off drive circuitry $25_2$ allows the high voltage supply HV1 to be as high as the sum of the breakdown voltages of M2 and M3.

Figure 6:
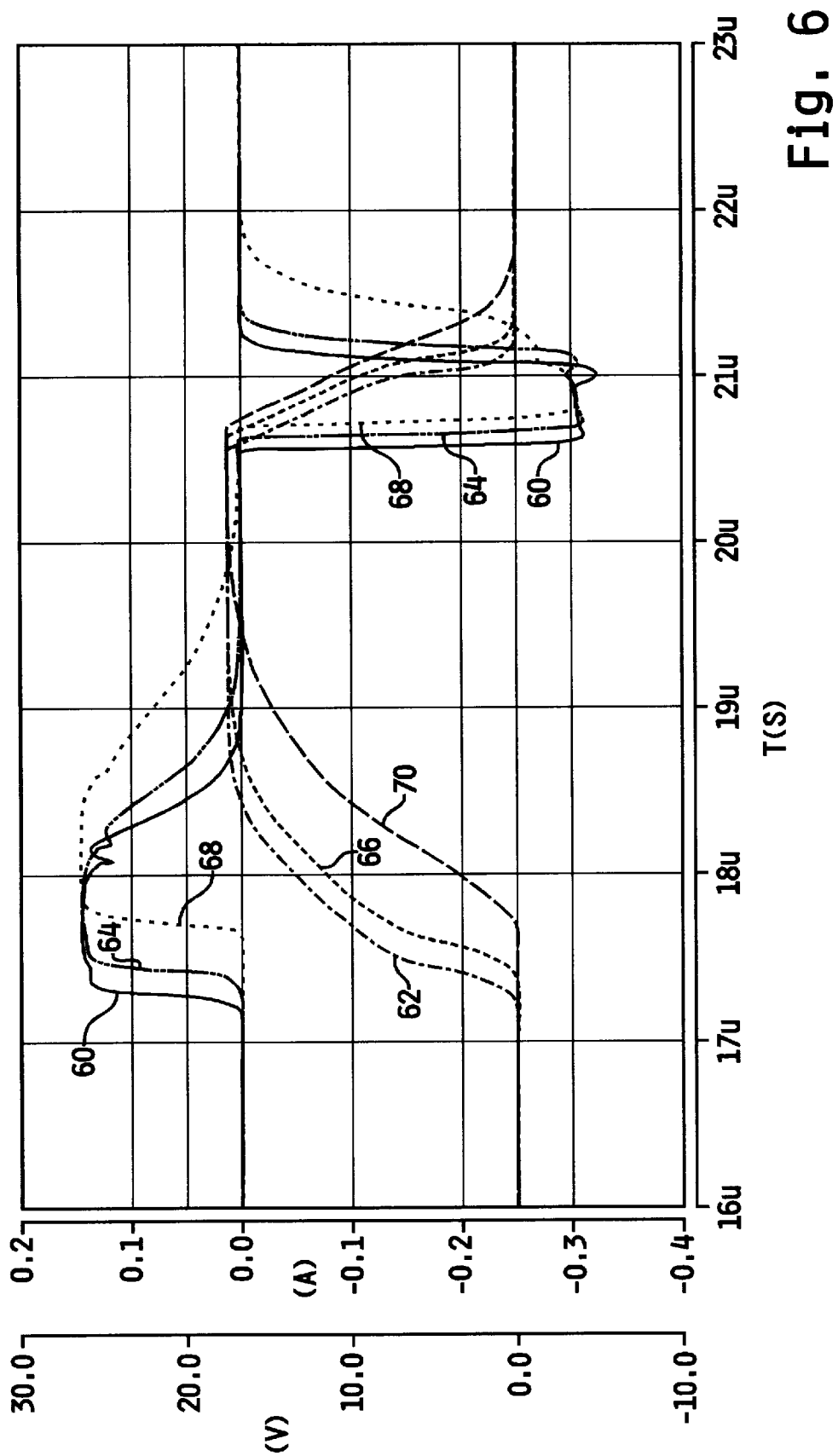
FIG. 6 is a plot illustrating the operation of the predriver circuit of FIGS. 1–4 showing example predriver circuit output voltages and output transistor drain currents vs. time for three operating temperatures and for a set of supply voltages different than used for the plot of FIG. 5.

Also, the design of pre-driver circuit 25 provides for consistent operation over a wide range of high voltage supply values HV1 and HV2. This is illustrated in FIG. 6 which shows a plot of VOUT 62 and $I_{LOAD}$ 60 for −40° C., VOUT 66 and $I_{LOAD\ 64\ for}$ 27° C., and VOUT 70 and $I_{LOAD\ 68\ for}$ 150° C. wherein HV1=15 volts and HV2=7.5 volts. Comparison with FIG. 5 illustrates no significant difference in operation of pre-driver circuit even through HV1 and HV2 have been reduce by a factor of two between FIGS. 5 and 6.

Figure 7:
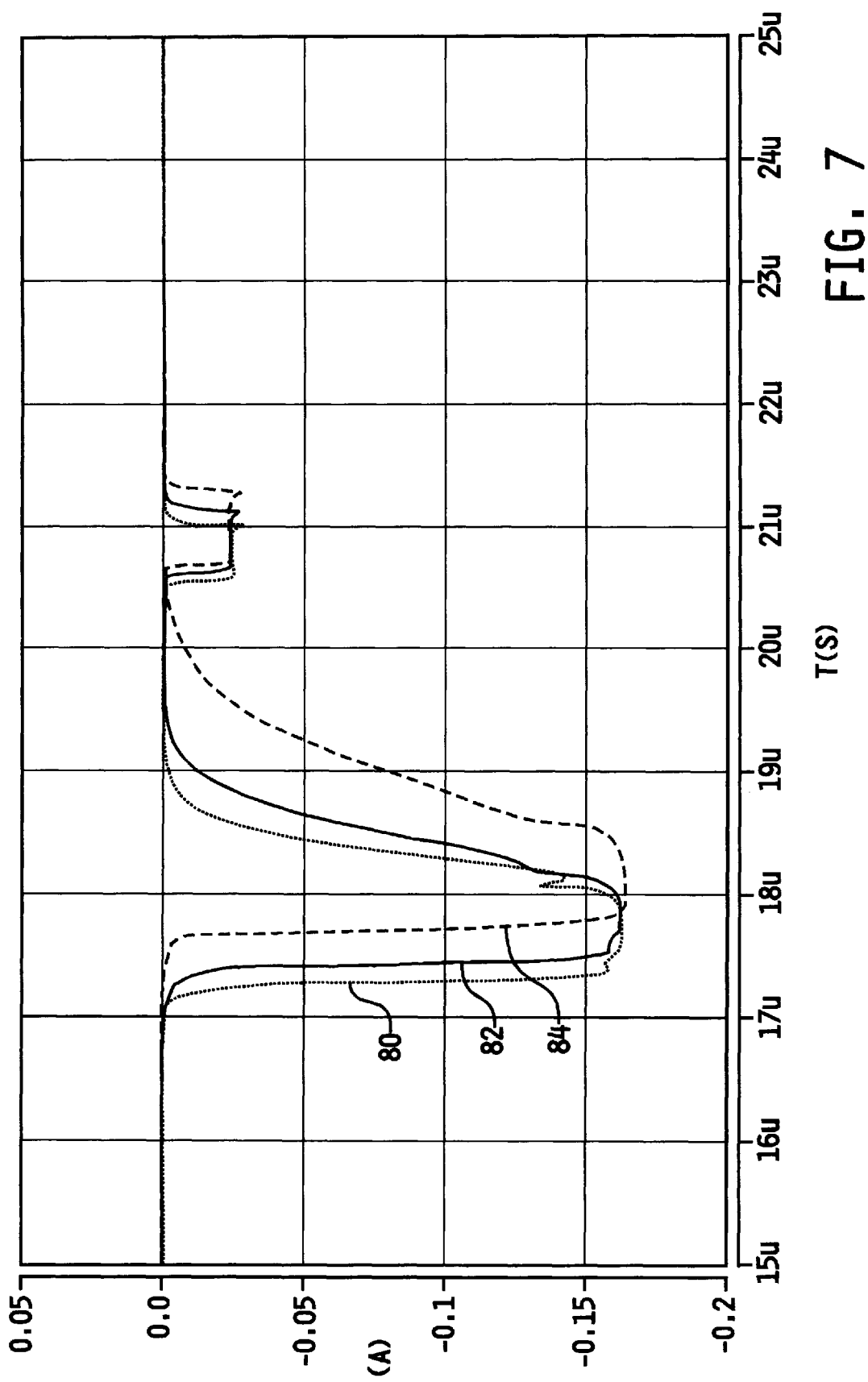
FIG. 7 is a plot illustrating the operation of the predriver circuit of FIGS. 1–4 showing example supply currents drawn from HV1 vs. time during turn on and turn off operations of the predriver circuit for three operating temperatures.

Additionally, the design of both the turn-on drive circuit $25_1$ and the turn-off drive circuit $25_2$ provides for electrical power efficient operation of the pre-driver circuit 25 by turning off all but the output portion of the respective output amplifier stage immediately upon detection of appropriate VOUT voltages while also maintaining appropriate on resistances of M1–M3 for the duration of the VCLK state to thereby maintain a desired load current. This feature is illustrated in FIG. 7 which is a plot of HV1 drain current vs. time for −40° C. (80), 27° C. (82) and 150° C. (84) operation of pre-driver circuit 25. By comparing FIG. 7 with FIGS. 5 and 6, it is evident that HV1 drain current decreases significantly following disablement of the various amplifier stages, as described hereinabove, immediately following appropriate VOUT voltages.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A predriver circuit for controlling a power drive circuit, comprising:

a turn on drive circuit having a first analog input adapted to receive a first analog signal and an analog output adapted for connection to an input of a power drive circuit, said turn on drive circuit responsive to one of an active and an inactive state of a first digital control signal to supply an amplified representation of said first analog signal to said analog output, and to the other of an active and inactive state of said first digital control signal to disable supply of said amplified representation of said first analog signal to said analog output; and a turn off drive circuit having a second analog input adapted to receive a second analog signal and an analog output defined by said analog output of said turn on drive circuit, said turn off drive circuit responsive to the other of an active and an inactive state of said first digital control signal to draw an amplified representation of said second analog signal from said analog output, and to said one of an active and an inactive state of said first digital control signal to disable draw of said amplified representation of said second analog signal from said analog output.

2. The predriver circuit of claim 1 wherein said turn on drive circuit includes:

a first analog signal amplifier defining said first analog input;

a second analog signal amplifier coupled to said first signal amplifier and defining said analog output; and a first disabling circuit responsive to the other of an active and an inactive state of said first digital control signal to disable operation of said second analog signal amplifier.

3. The predriver circuit of claim 2 wherein said first disabling circuit includes:

a first current source; and a first logic gate responsive to said one of an active and an inactive state of said first digital control signal to deactivate said first current source, and to the other of an active and an inactive state of said first digital control signal to activate said first current source;

and wherein said second analog signal amplifier is responsive to deactivation of said first current source to enable supply of said amplified representation of said first analog signal to said analog output, and to activation of said first current source to disable supply of said amplified representation of said first analog signal to said analog output.

4. The predriver circuit of claim 2 further including a second disabling circuit responsive to the other of an active and an inactive state of said first digital control signal to disable operation of said first analog signal amplifier.

5. The predriver circuit of claim 4 wherein said second disabling circuit includes:

a second current source; and a second logic gate responsive to said one of an active and an inactive state of said first digital control signal to deactivate said second current source, and to the other of an active and an inactive state of said first digital control signal to activate said second current source;

and wherein said first analog signal amplifier is responsive to deactivation of said second current source to enable amplifying operation thereof, and to activation of said second current source to disable amplifying operation thereof.

6. The predriver circuit of claim 1 wherein said first and second analog signals each have signal magnitudes;

and wherein said signal magnitudes of said first and second analog signals are chosen to minimize electromagnetic interference produced by said predriver circuit while maximizing slew rates of said turn on and turn off drive circuits.

7. A predriver circuit for controlling a power drive circuit, comprising:

a first analog signal amplifier defining an input adapted to receive a first analog signal;

a second analog signal amplifier coupled to said first analog signal amplifier and defining an output adapted for connection to an input of a power drive circuit, said first and second analog signal amplifiers responsive to a first state of a predriver control signal to supply an amplified representation of said first analog signal to said output;

a sense circuit responsive to detection of said amplified representation of said first analog signal to disable operation of said first analog signal amplifier and a first portion of said second analog signal amplifier to thereby reduce electrical power consumed thereby;

a control circuit responsive to disablement of said first analog signal amplifier and said first portion of said second analog signal amplifier to maintain a second portion of said second analog signal amplifier operable to thereby maintain said output near a predefined signal level for a duration of said first state of said predriver control signal; and a turn off drive circuit responsive to a second state of said predriver control signal to draw a second analog signal from said output.

8. The predriver circuit of claim 7 wherein said first analog signal amplifier includes a first transistor defining said input thereof and a second transistor coupled to said second analog signal amplifier, said first and second transistors decoupled from each other by a third transistor disposed therebetween.

9. The predriver circuit of claim 8 wherein said sense circuit includes:

an analog sensing circuit operable to produce an analog sense signal in response to detection of said amplified representation of said first analog signal at said output of said second analog signal amplifier;

a first digital logic circuit responsive to said analog sense signal to produce a digital disable signal; and a fourth transistor operatively connected to said second transistor and responsive to said digital disable signal to disable transfer of said first analog signal from said first transistor to said second transistor to thereby disable operation of said first analog signal amplifier.

10. The predriver circuit of claim 9 wherein said second analog signal amplifier includes:

a first transistor coupled to said second transistor of said first analog signal amplifier and to a voltage source;

a sixth transistor connected between said voltage source and said output of said second analog signal amplifier;

a first diode having an anode operatively connected to said fifth transistor and a cathode; and a second diode having an anode operatively connected to said sixth transistor and a cathode connected to said cathode of said first diode, said second analog signal amplifier thereby having said fifth transistor decoupled from said sixth transistor.

11. The predriver circuit of claim 10 wherein said fourth transistor is responsive to said digital disable signal to further disable current flow through said fifth transistor to thereby disable said first portion of said second analog signal amplifier.

12. The predriver circuit of claim 10 wherein said control circuit includes:

a second digital logic circuit responsive to said digital disable signal to produce a digital output control signal; and an analog control circuit responsive to said digital output control signal to maintain said sixth transistor in an on state with said output of said second analog signal amplifier near a voltage level defined by said voltage source for said duration of said first state of said predriver control signal.

13. The predriver circuit of claim 7 wherein said control circuit is further responsive to disablement of said first analog signal amplifier and said first portion of said second analog signal amplifier to maintain said second portion of said second analog signal amplifier operable to thereby provide a predefined load current to said output.

14. The predriver circuit of claim 13 wherein said second portion of said second analog amplifier includes an output transistor operable to source current to said output;

and wherein said control circuit is operable to maintain said second portion of said second analog signal amplifier operable to thereby provide a predefined load current to said output by maintaining a predefined on resistance of said output transistor.

15. A predriver circuit for controlling a power drive circuit, comprising:

a turn on drive circuit responsive to a first state of a predriver control signal to supply a first analog signal to a predriver circuit output thereof, said predriver circuit output adapted for connection to an input of a power drive circuit;

a first analog signal amplifier defining an input adapted to receive a second analog signal;

a second analog signal amplifier having an input coupled to said first analog signal amplifier and defining a second amplifier output;

a third analog signal amplifier coupled to said second amplifier output and defining an output connected to said predriver circuit output, said first, second and third amplifiers responsive to a second opposite state of said predriver control signal to draw an amplified representation of said second analog signal from said predriver circuit output;

a sense circuit responsive to detection of said amplified representation of said second analog signal drawn from said predriver circuit output to disable operation of said first and second analog signal amplifiers and a first portion of said third analog signal amplifier to thereby reduce electrical power consumed thereby; and a control circuit responsive to disablement of said first and second analog signal amplifiers and said first portion of said third analog signal amplifier to maintain a second portion of said third analog signal amplifier operable to thereby maintain said predriver circuit output near a predefined signal level for a duration of said second state of said predriver control signal.

16. The predriver circuit of claim 15 wherein said first analog signal amplifier includes a first transistor defining said input thereof and a second transistor coupled to said second analog signal amplifier, said first and second transistors decoupled from each other by a third transistor disposed therebetween.

17. The predriver circuit of claim 16 wherein said sense circuit includes:

an analog sensing circuit operable to produce an analog sense signal in response to detection of said amplified representation of said second analog signal drawn from said output of said third analog signal amplifier;

a first digital logic circuit responsive to said analog sense signal to produce a digital disable signal; and a fourth transistor operatively connected to said second transistor and responsive to said digital disable signal to disable transfer of said second analog signal from said first transistor to said second transistor to thereby disable operation of said first analog signal amplifier.

18. The predriver circuit of claim 17 wherein said second analog signal amplifier includes:

a fifth transistor coupled to said second transistor of said first analog signal amplifier and to a voltage source; and a sixth transistor connected between said voltage source and said output of said second analog amplifier, and operatively connected to said fifth transistor to form a current mirror.

19. The predriver circuit of claim 18 wherein said third analog signal amplifier includes:

a seventh transistor coupled to said output of said second analog signal amplifier;

an eighth transistor connected to said output of said third analog signal amplifier and coupled to a reference potential;

a first diode having an anode operatively connected to said seventh transistor and a cathode; and a second diode having an anode operatively connected to said eighth transistor and a cathode connected to said cathode of said first diode, said seventh and eighth transistors thereby decoupled from each other.

20. The predriver circuit of claim 19 wherein said fourth transistor is responsive to said digital disable signal to further disable current flow through said seventh transistor to thereby disable said first portion of said third analog signal amplifier.

21. The predriver circuit of claim 19 wherein said control circuit includes:

a second digital logic circuit responsive to said digital disable signal to produce a digital output control signal; and an analog control circuit responsive to said digital output control signal to maintain said eighth transistor in an on state with said output of said third analog signal amplifier near a voltage level defined by said reference potential for said duration of said second state of said predriver control signal.

22. The predriver circuit of claim 15 wherein said control circuit is further responsive to disablement of said first and second analog signal amplifiers and said first portion of said third analog signal amplifier to maintain said second portion of said third analog signal amplifier operable to thereby draw a predefined load current from said output.

23. The predriver circuit of claim 22 wherein said second portion of said third analog amplifier includes at least one output transistor operable to sink current from said output;

and wherein said control circuit is operable to maintain said second portion of said third analog signal amplifier operable to thereby draw a predefined load current from said output by maintaining a predefined on resistance of said at least one output transistor.

24. A predriver circuit for controlling a power drive circuit, comprising:

a turn on drive circuit having a first analog input adapted to receive a first analog signal and an analog output adapted for connection to an input of a power drive circuit, said turn on drive circuit responsive to one of an active and an inactive state of a first digital signal to supply an amplified representation of said first analog signal to said analog output and to produce a digital turn off circuit disable signal; and a turn off drive circuit having a second analog input adapted to receive a second analog signal and an analog output defined by said analog output of said turn on drive circuit, said turn off drive circuit responsive to the other of an active and inactive state of said first digital control signal to draw an amplified representation of said second analog signal from said analog output and to produce a digital turn on circuit disable signal;

wherein said turn on circuit is responsive to said digital turn on circuit disable signal to disable operation thereof by disabling supply of said amplified representation of said first analog signal to said analog output;

and wherein said turn off circuit is responsive to said digital turn off circuit disable signal to disable operation thereof by disabling draw of said amplified representation of said second analog signal from said analog output.

25. The predriver circuit of claim 24 wherein said turn on circuit includes a first control circuit responsive to said one of an active and an inactive state of said first digital signal to produce said digital turn off circuit disable signal, and to the other of an active and an inactive state of said first digital signal to produce a digital turn off circuit enable signal, said turn off circuit responsive to said digital turn off circuit enable signal to enable operation thereof.

26. The predriver circuit of claim 24 wherein said turn off circuit includes a second control circuit responsive to the other of an active and an inactive state of said first digital signal to produce said digital turn on circuit disable signal, and to said one of an active and an inactive state of said first digital signal to produce a digital turn on circuit enable signal, said turn on circuit responsive to said digital turn on circuit enable signal to enable operation thereof.

27. The predriver circuit of claim 24 wherein said first and second analog signals each have signal magnitudes;

and wherein said magnitudes of said first and second analog signals are chosen to minimize electromagnetic interference produced by said predriver circuit while maximizing slew rates of said turn on and turn off drive circuits.

* * * * *